United States Patent [19]

Millhollan et al.

[11] Patent Number: 4,841,176
[45] Date of Patent: Jun. 20, 1989

[54] OUTPUT DISABLE CONTROL CIRCUIT FOR ECL PROGRAMMABLE ARRAY LOGIC DEVICE

[75] Inventors: Michael S. Millhollan, Saratoga; Chiakang Sung, San Jose, both of Calif.

[73] Assignee: National Semiconductor Corporation, Santa Clara, Calif.

[21] Appl. No.: 34,400

[22] Filed: Apr. 3, 1987

Related U.S. Application Data

[62] Division of Ser. No. 868,641, May 29, 1986.

[51] Int. Cl.$^4$ ............... H03K 19/092; H03K 17/16; H03K 19/088
[52] U.S. Cl. ................. 307/475; 307/443; 307/456; 307/467; 364/716
[58] Field of Search ............... 307/454-456, 307/443, 202.1, 465-467, 200 A, 475, 470, 243; 364/716

[56] References Cited

FOREIGN PATENT DOCUMENTS 0195489 9/1986 European Pat. Off. ........... 307/465

OTHER PUBLICATIONS

Schmitz/Hingarh, "An ECL Programmable Logic Array", 1984 IEEE International Solid-State Circuits Conference, Feb. 24, 1984, p. 264.
Millhollan/Sung, "A 3.6ns ECL Programmable Array Logic IC", 1985 IEEE International Solid-State Circuits Conference, Feb. 14, 1985, p. 202.

Primary Examiner—John S. Heyman
Assistant Examiner—M. R. Wambach
Attorney, Agent, or Firm—Limbach, Limbach & Sutton

[57] ABSTRACT

The present invention provides circuitry for disabling the output gate of an ECL programmable array logic device so that TTL programming and test signals may be applied to the ECL output node. The disable control circuit is responsive to a control signal to provide pull down current to the ECL output gate. A sensing circuit connected to the ECL output senses the TTL voltage level on the output in the programming mode without disturbing the ECL output in the normal mode.

5 Claims, 3 Drawing Sheets

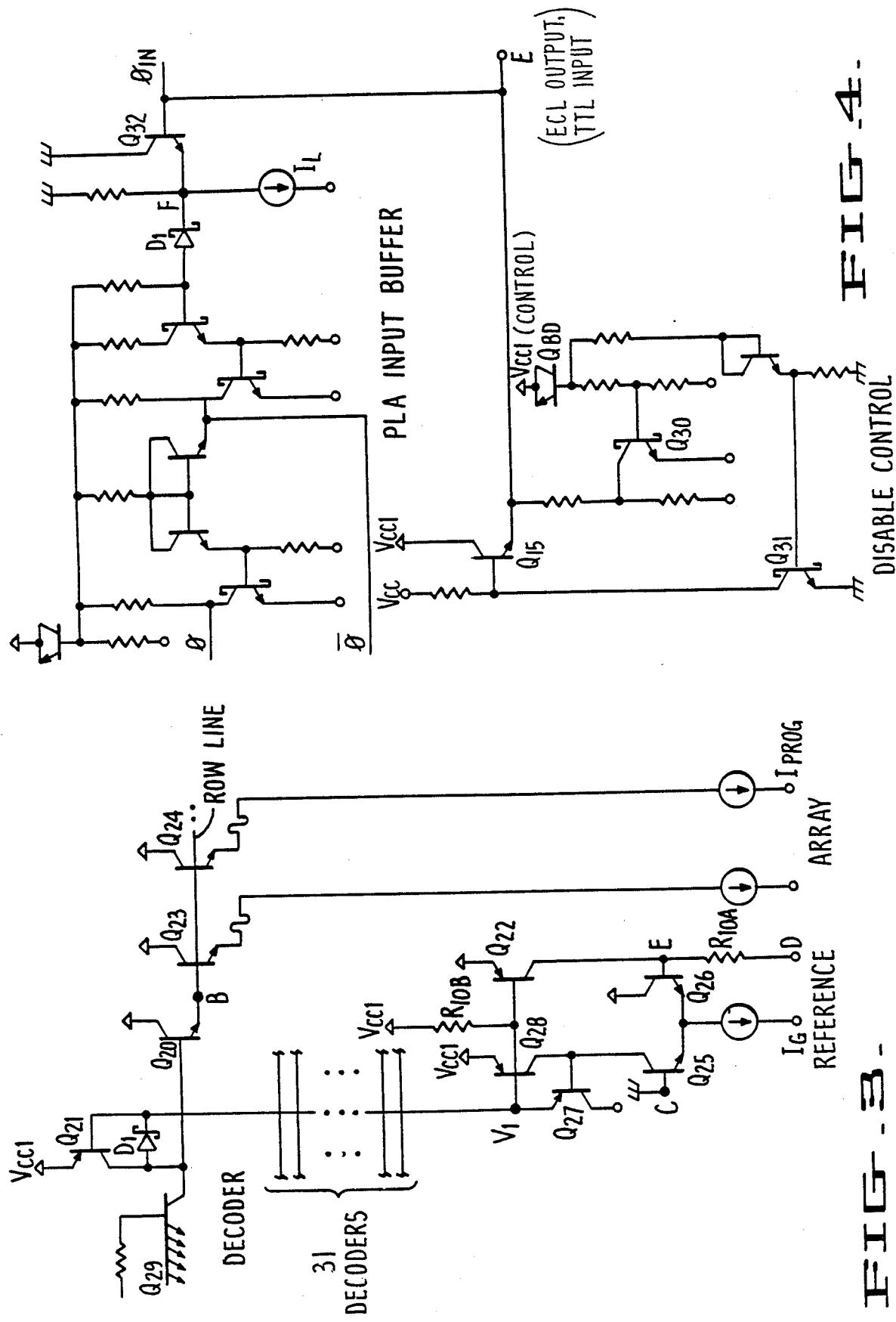

OUTPUT DISABLE CONTROL CIRCUIT FOR ECL PROGRAMMABLE ARRAY LOGIC DEVICE

This is a divisional of application Ser. No. 868,641, filed May 29, 1986.

BACKGROUND OF THE INVENTION

1. Field of the Invention

The present invention relates to semiconductor integrated circuits and, more particularly, to a high speed ECL programmable array logic device which utilizes a unique voltage reference circuit for the program driver and a new ECL output disable control circuit to allow for TTL programming.

2. Discussion of the Prior Art

Programmable logic devices are essentially uncommitted logic gates where the user determines the final logic configuration of the device. The internal structure of these devices is a fuse-programmable interconnection of AND gates, OR gates and registers which allows the user to design combinational as well as sequential circuits.

The first programmable logic device was the diode matrix, which was introduced in the early 1960's. This device featured rows and columns of metalization connected at the cross points with diodes and aluminum fuses. These fuses could be selectively melted, leaving some of the cross points open and others connected. The result was a diode-logic OR matrix.

Input decoders and output buffers were then added to the basic diode matrix, creating the field-programmable read-only memory (PROM). The PROM extended the programmable-logic concept considerably, since the input variables could now be encoded. It also reduced the number of pins required per input variable. At the same time, the input circuitry, along with the output buffers, provided TTL compatibility, the lack of which was one of the drawbacks of the diode matrix. A decoder is nothing more than a collection of AND gates that combine all the inputs to produce product terms. The basic logic implemented by the PROM is AND-OR with the AND gates all preconnected on the chip, making this portion fixed. The OR matrix is implemented with diode-fuse interconnections, making it programmable. Thus, the PROM is an AND-OR logic device with a fixed AND matrix and a programmable OR matrix.

However, it is difficult to accommodate a large number of variables with PROMs. For each variable added to the PROM, not only does the package size increase by one pin, but the size of the matrix doubles as well. Therefore, as a practical matter, PROMs are limited in the maximum number of input variables they can be designed to handle.

The field-programmable logic array (FPLA) overcomes some of the size restrictions of PROMs. By utilizing a second fuse matrix, an AND matrix, the FPLA allows the designer to select and program only those product terms used in each specific function. These product terms are then combined in the OR fuse array to form an AND-OR logic equation. An ECL FPLA is described by Schmitz et al., "An ECL Field Programmable Logic Array", 1984 IEEE International Solid-State Circuits Conference, p. 264. However, because of the dual fuse matrix and the overhead cost of the circuitry required for programming, the FPLA cannot be used economically in low complexity logic applications. Cost savings similar to those of PROMS can be made without the penalty of restricting the input variables, by removing the OR matrix from the FPLA, or hard wiring it. Thus, in the programmable array logic device concept, the AND fuse array allows the designer to specify the product terms required. The terms are then hard wired to a predefined OR matrix to form AND-OR logic functions.

Because the OR gates in a programmable array logic device are prewired, the degree to which the product terms can be combined at these OR gates is restricted. Programmable array logic vendors partially compensate for this by offering different part types with varying OR-gate configurations. Specifying the OR-gate connection, therefore, becomes a task of device selection rather than one of programming, as with the FPLA. With this approach, programmable array logic devices eliminate the need for a second fuse matrix with little loss in overall flexibility.

Recently, programmable array logic devices have been implemented in emitter-coupled logic technology (see Millhollan and Sung, "A 3.6 ns ECL Programmable Array Logic IC", 1985 IEEE International Solid-State Circuits Conference, p. 202). Emitter-coupled logic (ECL) is best known for its high-speed operation. ECL is a non-saturating form of digital logic that eliminates transistor storage time as a speed-limiting characteristic, permitting very high speed operation.

SUMMARY OF THE INVENTION

The present invention provides circuitry for disabling the output gate of an ECL programmable array logic device so that TTL programming and test signals may be applied to the ECL output node. The disable control circuit is responsive to a control signal to provide pull down current to the ECL output gate. A sensing circuit connected to the ECL output senses the TTL voltage level on the output in the programming mode without disturbing the ECL output in the normal mode.

A BRIEF DESCRIPTION OF THE DRAWING

FIG. 3 is a schematic diagram illustrating a voltage reference circuit used in conjunction with the present invention; and FIG. 4 is a schematic diagram illustrating an ECL output disable control circuit in accordance with the present invention.

DETAILED DESCRIPTION OF THE PREFERRED EMBODIMENT

Figure 1:
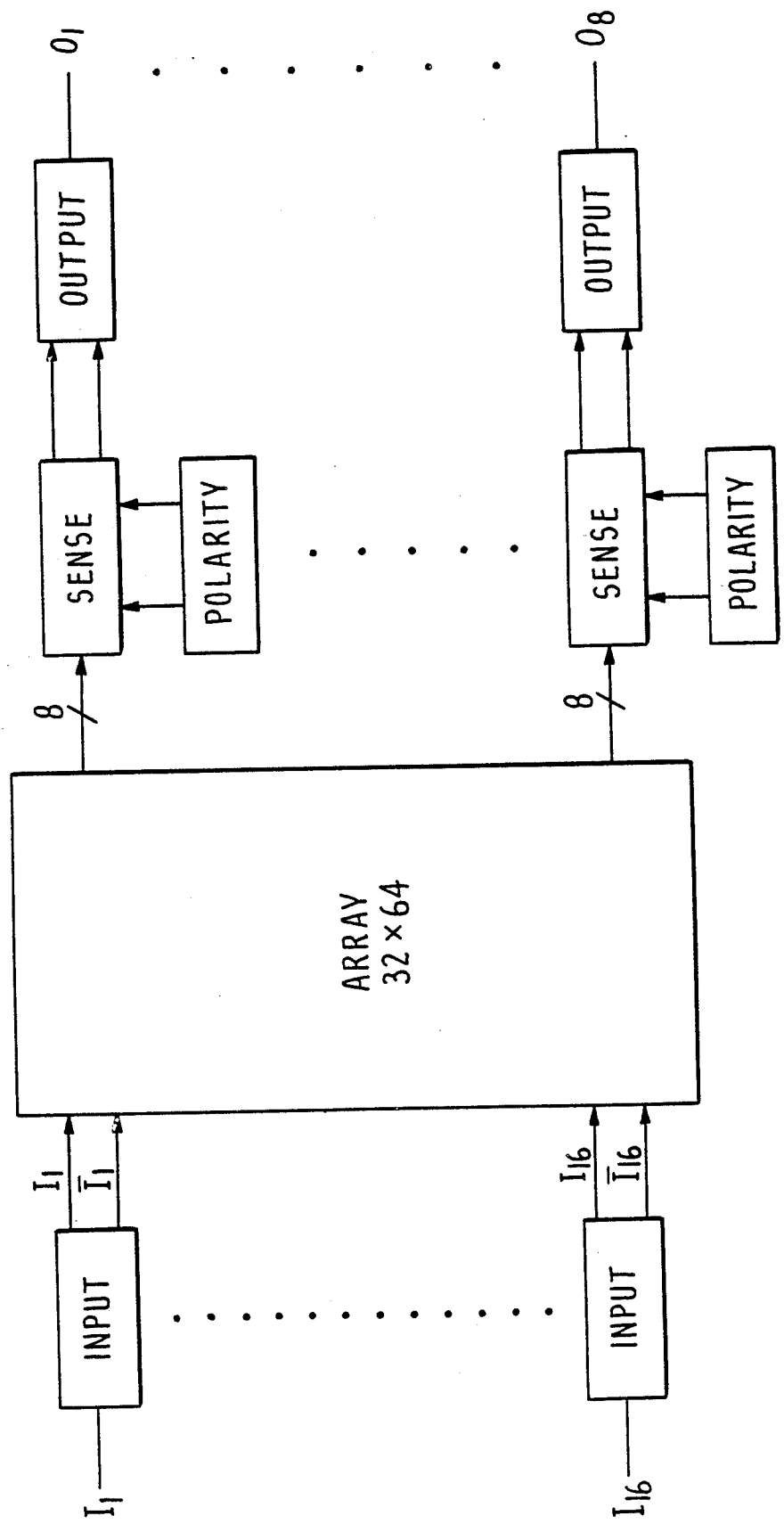
FIG. 1 is a block diagram illustrating the general configuration of a prior art ECL programmable array logic device.
Figure 2:
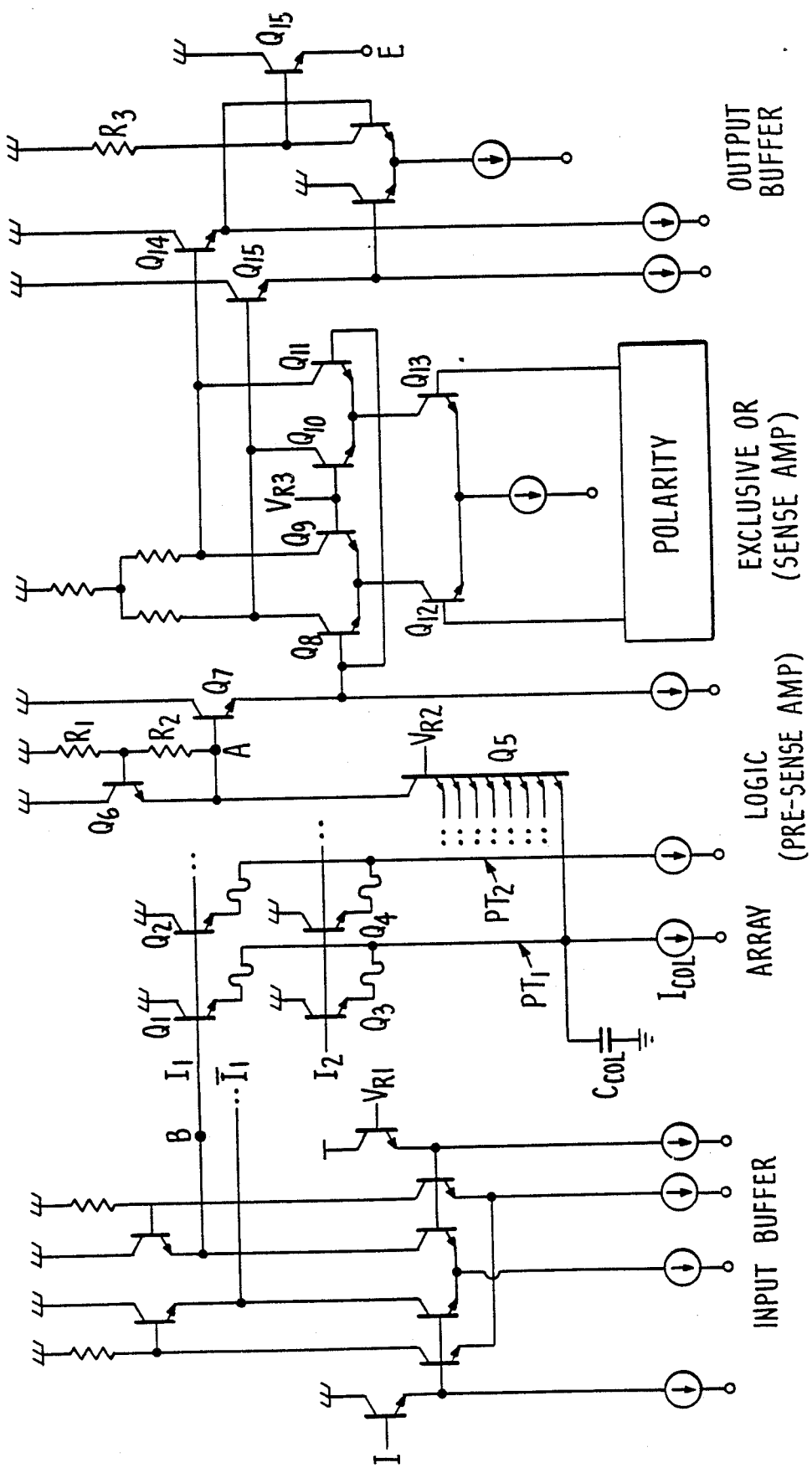
FIG. 2 is a partial schematic diagram illustrating the prior art ECL programmable array logic device shown in FIG. 1.

FIGS. 1 and 2 show the basic configuration of an ECL programmable array logic device of the type described in the above-mentioned article by Millhollan and Sung. The most important design criteria in developing high speed ECL programmable logic devices is to provide minimum input to output delay. One of the keys to this performance is the realization of a very high speed circuit that performs logic sense of the fuse array at a reduced voltage swing.

The device shown in FIGS. 1 and 2 is organized as 16 inputs, 64 products terms and 8 outputs. It has a propagation delay of 3.6 ns at a power dissipation of 1.0W. An on-chip TTL programmable logic array, not shown, is used for field programming and test functions.

Referring to FIG. 2, the input buffer of the device uses parallel gates to provide push-pull drive to the fuse array and has a typical delay of 1.5 ns at 3.0 mA.

The logic function is performed by a pre-sense amplifier circuit which includes a cascoded multi-emitter transistor $Q_5$, which is connected to the column lines PT of the fuse array. This configuration allows the voltage swing on the highly capacitive array fuse column to be less than 400 mv, resulting in improved delay performance. The delay from the fuse array row input, node B, to the collector of the cascode transistor $Q_5$, node A, is 0.8 ns with a 0.8 mA pulldown current source on each array fuse column.

The logic signal at node A is then applied to an exclusive OR gate, the sense amplifier shown in FIG. 2, which provides the ability to drive the output gate differentially, allows for level shifting and allows the polarity of the function to be inverted. The output polarity is selected by fuse programming a dc voltage level on the inputs to the lower series gate $Q_{12}$, $Q_{13}$ of the exclusive OR, complementing the logic function with no delay penalty. The delay of the exclusive OR is 0.5 ns at 3.0 mA. The output buffer responds in 0.8 ns at 4.5 mA.

For the standard programmable array logic device, the output term may be represented as a sum-of-products logic equation, $$Q = (A*B) + (C*D) \quad (1)$$

For the device illustrated in FIGS. 1 and 2, each output function is the sum of eight product terms, where a product term can represent the "ANDing" of the 16 independent inputs.

The description provided above describes how the function is implemented by logic blocks. However, it is actually performed on-chip slightly differently;

if $F = (A*B) + (C*D)$, then from DeMorgan (2)
$F = (\overline{A} + \overline{B}) * (\overline{C} + \overline{D})$. (3)

As shown in FIG. 2, each of the OR functions is formed by an emitter OR tie created by a fuse link connecting the array row transistor emitters to the column. For each input $I_n$, one of these fusible connections must be removed or the corresponding product term column will always be high. In the preferred embodiment of the present invention, the fuse links are created using a thin film of tungsten. The OR functions created on the columns are then NANDed at the collector of the multiple-emitter transistor $Q_5$.

The AND function created at node A is accomplished by setting the base voltage $V_{R2}$ of multiple-emitter transistor $Q_5$ equal to the mid-swing voltage of inputs $I_1$ and $I_2$, which in this case, are the outputs of an inverter/driver circuit.

The column edge rates are very critical to the speed of the overall circuit. The array drivers are emitter-followers and pull the column up rapidly. However, the fall rate of the column is a very linear function of the total column capacitance $C_{COL}$, which is composed of parasitic transistor and interconnect capacitances and the column current source value $I_{COL}$. Fast discharge equates to large column currents, but since this current is multiplied by 64 (one for each column), this becomes the single most power-consuming portion of the circuit. Therefore, as a compromise, the total voltage excursion of the column line (e.g., $PT_1$) is reduced to about half the normal voltage swing of an ECL logic gate.

The voltage on node A is set by whether the column current $I_{COL}$ is supplied by the array transistor, in this case transistors $Q_{1-4}$, or by transistor $Q_5$. This means that if only one of the column lines or all eight are low (i.e., the input voltage is lower than $V_{R2}$), node A is low.

If there were only a resistor connected to node A from the supply, the voltage would vary from $V = (I_{column} \times R)$ to $V = (8I\ column \times R)$, depending upon the logic function being defined. For this reason, the clamp created by transistor $Q_6$ and resistors $R_1$ and $R_2$ is used. To a first order approximation, the current through resistor $R_2$ flows through resistor $R_1$, the current through $R_2$ is approximately $$\frac{V_{be}|Q_6}{R2} \quad (5)$$

This term will vary as $KT/q*\ln(N)$, where $N=1$ through 8, that is, the base-emitter voltage of transistor $Q_6$ will vary depending upon the total amount of current flow through transistor $Q_6$, which is a function of the number of array column lines that are low.

In reality, the voltage on node A will vary more than this, but will always be about $$(V_{be}|Q_6) * \frac{R_1}{R_2} \quad (6)$$

whenever any one or more of the column currents flows through cascoded transistor $Q_5$.

The voltage on node A, which represents the logic function at Equation 3 above, is then level shifted by emitter follower transistor $Q_7$ and applied as an input to the exclusive OR gate consisting of transistors $Q_8$–$Q_{13}$. At this point, the function is exclusive OR-ed with the differential output of the polarity circuit to give the differential output F or $\overline{F}$ which is then applied to the ECL output gate by emitter followers $Q_{14}$, $Q_{15}$.

In the ECL programmable array logic device just described, the blowing of the tungsten (W) fuses normally requires a large programming current flow, as compared to the normal column current $I_{CA}$ through the fuse. As shown in FIG. 3, this program current $I_{PROG}$ is sourced by a Darlington connected transistor pair $Q_{20}$, $Q_{24}$ driven by a PNP transistor $Q_{21}$. The voltage across the fuse must be over-designed to provide a large safety margin to process variations. Therefore, the voltage applied to the base of the Darlington connected transistor pair $Q_{20}$, $Q_{24}$ must be designed so that it is as high as possible to provide the required margin.

The fuse array consists of a 32 row by 64 column matrix of emitter follower/fuse link elements. To program this array, the individual fuse elements must be selected. This is done by creating a one-of-thirty-two row decode and a one-of-sixty-four column decode. FIG. 3 shows one of the row decode drivers, consisting of multiple-emitter transistor $Q_{29}$, PNP transistor $Q_{21}$ and diode $D_1$. The individual row is selected by decoding inputs to the multiple-emitter transistor $Q_{29}$. If all inputs to transistor $Q_{29}$ are logically high, the row is selected. When the row is selected, sufficient current must be available to the base of the Darlington connected transistor $Q_{20}$ to provide source current for programming. This current is provided by the collector of PNP transistor 21 and is set by the reference circuit consisting of transistors $Q_{22}$, $Q_{25}$, $Q_{26}$, $Q_{27}$, and $Q_{28}$.

More specifically, as will be described in greater detail below, the collector current of transistor $Q_{21}$ is set as a function of the value of resistor $R_{104}$.

The collector current of PNP transistor $Q_{21}$ must be set so as not to be so great as to overload the decoder, but sufficient to provide base drive for programming. Optimally, in the illustrated embodiment, this current has been determined to be about 200 mA.

During programming, node C is connected to approximately +5V and node D is connected to ground. Transistors $Q_{22}$ and $Q_{25-28}$ are connected as a differential amplifier with unity gain negative feedback. Current $I_G$ will initially flow through transistor $Q_{25}$ and be applied as base current to transistor $Q_{27}$. The resulting emitter current of transistor $Q_{27}$ will act as base current for transistors $Q_{22}$, $Q_{28}$, and $Q_{21}$. Transistor $Q_{22}$ will then conduct collector current which will force the base of transistor $Q_{26}$, node E, to attempt to rise to the same level as the voltage on node C. This can only be done by supplying sufficient current through resistor $R_{104}$. Therefore, the collector current of transistor $Q_{22}$ may be accurately set by resister $R_{104}$.

Transistors $Q_{22}$ and $Q_{21}$ are matched. Therefore, $I_C|Q_{22} = f(R_{104})$ $I_C|Q_{22} = I_C|Q_{21}$ Thus, the current available to each of the thirty-two row lines of the array may be very accurately controlled.

A major advantage of the circuitry shown in FIG. 3 is that it may be totally shut-off during normal operation. When the reference current $I_G$ is turned off, all of the PNP transistors in the circuit turn off. Therefore, there is no wasted power. If resistors or NPN transistors were used for this function, then the circuitry would require power during normal operation to hold them off.

A secondary advantage is that the collector current supplied by transistor $Q_{21}$ is reasonably invariant which processing variations, such as beta at the low quality PNP transistor created by standard process technique.

Furthermore, the junction breakdown at the PNP transistor $Q_{21}$ provides the greatest amount of voltage sustaining capability which allows maximum programming voltages to be used.

Also, the clamp circuit created by diode D allows the base at the Darlington configuration $Q_{20}$, $Q_{24}$ to rise higher than it could using only NPN drive transistors without saturating transistor $Q_{21}$.

Therefore, in summary, the circuit shown in FIG. 3 provides a controlled amount of base current for the array driver transistors in the programming mode. At the same time, the circuit may be totally shut down during normal operation.

Since virtually all commercially available programming equipment now available is TTL based, to enhance commercial acceptance at the ECL PLA described above, it is made to emulate a TTL-compatible 2048×1 TTL PROM. This is accomplished by utilizing an on-chip programmable array logic circuit to control the programming function of the device.

However, it is difficult to provide both addresses for the fuse location and to apply external programming instructions simultaneously with the limited number of input pins. To solve this problem, when the on-chip PLA is enabled, the normal ECL output buffers must be disabled so that the associated output node can be used as an input.

FIG. 4 shows an ECL output disable control circuit according to the present invention which is provided for this purpose. The normal ECL output gate, represented in part by resistor $R_3$ and transistor $Q_{15}$, is disabled when elevated voltage $V_{CC2}$ is applied to the device.

It should be remembered that the programmable logic array described above is operational in two modes: normal and programming. FIGS. 2–4 show connections to $V_{CC}$ (5 volts), ground and $V_{EE}$ (5.2 volts) in the normal operational mode. In the programming mode, $V_{CC}$ connections remain the same, connections to ground in the normal mode become connections to $V_{CC}$, and connections to $V_{EE}$ in the normal mode become connections to ground.

Referring to FIG. 2, transistor $Q_{15}$ and resistor $R_3$ comprise the ECL output gate of the programmable array logic device, providing an ECL output signal at node E. This configuration is also shown in FIG. 4.

In the programming mode, the base of transistor $Q_{15}$ is connected to the supply voltage $V_{CC}=5V$, through resistor $R_3$ having a value of about 200 ohms. To protect the integrity of the device in the programming mode, the voltage at the base of transistor $Q_{15}$ must be limited to less than 800 MV. Otherwise, when standard TTL input low level is applied to Node E, transistor $Q_{15}$ would supply excessive current and destroy the device.

Therefore, in accordance with the present invention, the disable control circuit shown in FIG. 4 is provided to pull the base of the output emitter-follower $Q_{15}$ as close to ground as possible.

As soon as control voltage $V_{CC1}$ goes above the breakdown voltage of the emitter-base junction of device $Q_{BD}$, the base node of device $Q_{BD}$ will follow $V_{CC}$ with about a 6V drop. That is, when $V_{CC1}$ goes to about 10V, the base node of transistor $Q_{BD}$ will go to about 4 volts turning on transistor $Q_{30}$. Transistor $Q_{30}$ then provides pull down current to the ECL output gate. At the same time, transistor $Q_{31}$ switches on, causing the base of the output device $Q_{15}$ to be as close to ground as possible, thereby effectively releasing the output node E.

In the programming mode, it is necessary to sense the TTL voltage levels on the output node E when the normal output device transistor $Q_{15}$ is turned off. But, this must be accomplished with circuitry which will not disturb the node during normal operation. If the normal TTL input, node F, of the PLA input buffer were connected directly to the output node E, it would provide a spurious path which would disturb the operation of the device. Therefore, a standard TTL input cannot be used to sense the output node E.

Rather, according to the present invention, a very high impedance connection is provided to transistor $Q_{32}$, the base of which is connected to the output node E. Node F is connected to a current source $I_L$. Thus, node F becomes essentially the same as the input to a standard TTL gate, except that the input current is set by current source $I_L$. Current $I_L$ is then provided through transistor $Q_{32}$ under control of the voltage on the output node E, or current is provided by the TTL gate, in which case it acts like a low.

In TTL devices, any voltage above 2 volts is considered "high" and any voltage less than 0.8V is considered "low". Therefore, if the output node E is more than approximately 2 volts, then there is no current flow through diode $D_1$ and device $Q_{32}$ is on. If the voltage at the output node drops below about 2 volts, then $I_L$ transfers into the diode, pulling node F low.

It should be understood that various alternatives to the embodiment of the invention described herein may be employed in practicing the present invention. It is intended that the following claims define the invention, and that the structure and methods within the scope of these claims and their equivalents be covered thereby.

What is claimed is:

1. Disable circuitry for disabling an output node of an ECL programmable array logic circuit so that the output node can serve as an input for TTL signals, the disable circuitry comprising:
   means for generating a control signal; and
   disable control means operatively connected to the output node and responsive to the control signal for disabling the output node such that TTL signals can be applied to the output node as inputs to the ECL programmable array logic circuit in a first mode.

2. Disable circuitry as in claim 1 and further including means for sensing the voltage level of the TTL signals on the output node in the first mode without disturbing the output node in a second operating mode of the ECL programmable array logic circuit.

3. Disable circuitry for disabling output circuitry of an ECL programmable array logic circuit so that the output circuitry can be used as input circuitry to the ECL programmable array logic circuit, the output circuitry including a bipolar output gate transistor having base, emitter and collector, the emitter of the output gate transistor being connected to the output circuitry, the disable circuitry comprising:
   (a) means for applying a control voltage to the collector of the output gate transistor; and
   (b) pull down means connected to the base of the output gate transistor and responsive to the control voltage to cause the base of the output gate transistor to be substantially grounded, thereby disabling the output circuitry.

4. Disable circuitry as in claim 3 wherein the pull down means comprises
   (a) a first transistor having its emitter and collector commonly connected to the means for applying the control voltage;
   (b) a second transistor having its base connected to the base of the first transistor, its collector connected to its base and its emitter connected to ground;
   (c) a third transistor having its base commonly connected to the base of the first transistor and to the means for supplying the control voltage, its emitter connected to the means for supplying the control voltage and its collector commonly connected to the means for supplying the control voltage and to the emitter of the output gate transistor; and
   (d) a fourth transistor having its base connected to the emitter of the second transistor, its emitter connected to ground and its collector connected to the base of the output gate transistor.

5. Disable circuitry as in claim 2 wherein the first mode is a programming mode and the second mode is a normal operating mode of the ECL programmable array logic circuit.

* * * * *